United States Patent [19]
Mok

[11] Patent Number: 5,729,433
[45] Date of Patent: Mar. 17, 1998

[54] MULTIPLE CHIP MODULE ASSEMBLY FOR TOP OF MOTHER BOARD

[75] Inventor: Sammy L. Mok, Cupertino, Calif.

[73] Assignee: MicroModule Systems, Inc., Cupertino, Calif.

[21] Appl. No.: 593,897

[22] Filed: Jan. 30, 1996

[51] Int. Cl.⁶ .................................................. H05K 7/20
[52] U.S. Cl. .......................... 361/704; 257/727; 361/719
[58] Field of Search ..................................... 257/706, 707, 257/713, 726, 727; 165/80.3, 185; 439/485, 487, 66, 74, 91; 174/16.3, 252; 361/704, 705, 707–710, 715–720, 785, 787, 788, 790, 792

[56] References Cited

U.S. PATENT DOCUMENTS

| | | | |
|---|---|---|---|
| 4,581,679 | 4/1986 | Smolley | 361/395 |
| 4,642,889 | 2/1987 | Grabbe . | |
| 4,774,632 | 9/1988 | Neugebauer . | |
| 5,003,429 | 3/1991 | Baker et al. . | |
| 5,007,841 | 4/1991 | Smolley | 439/66 |
| 5,010,038 | 4/1991 | Fox et al. . | |
| 5,065,280 | 11/1991 | Karnezos | 361/386 |
| 5,074,799 | 12/1991 | Rowlette, Sr. . | |
| 5,109,320 | 4/1992 | Bourdelaise | 361/413 |
| 5,229,917 | 7/1993 | Harris et al. . | |
| 5,251,097 | 10/1993 | Simmons et al. . | |
| 5,268,815 | 12/1993 | Cipolla | 361/704 |
| 5,321,583 | 6/1994 | McMahon . | |
| 5,345,364 | 9/1994 | Biernath | 361/749 |
| 5,402,077 | 3/1995 | Agahdel et al. | 324/758 |
| 5,421,079 | 6/1995 | Cipolla | 29/760 |
| 5,422,514 | 6/1995 | Griswold et al. | 257/679 |
| 5,424,913 | 6/1995 | Swindler . | |
| 5,435,733 | 7/1995 | Chernicky | 439/68 |
| 5,457,604 | 10/1995 | Ando . | |
| 5,473,510 | 12/1995 | Dozier, II . | |
| 5,619,399 | 4/1997 | Mok | 361/707 |

*Primary Examiner*—Gerald P. Tolin
*Attorney, Agent, or Firm*—Wilson, Sonsini, Goodrich & Rosati

[57] ABSTRACT

An assembly for electronic components having heat spreaders on two sides comprises a mother board on which to mount electronic components, having a top side with an array of board contacts. A multiple chip integrated circuit module carries integrated circuits. The multiple chip module consists of a first substrate, such as aluminum, with a multi-layer interconnect structure on one surface of the aluminum substrate. The integrated circuits are mounted on the interconnect structure on the first substrate. A second substrate manufactured using printed wiring board technology, surrounds the first substrate, and includes an interconnect structure and an array of circuit contacts. Conductors connect the interconnect structure on the first substrate with the interconnect structure on the second substrate. A thermally conductive baseplate is coupled with the multiple chip module on the side opposite the array of circuit contacts. An interposer providing electrical connection between the array of circuit contacts on the multiple chip module and the array of board contacts on the printed wiring board is placed between the multiple chip module and the board. A top heat sink, such as a heat spreader assembly, is placed in contact with a second surface of a thermally conductive baseplate. On the first surface of the thermally conductive baseplate, a thermally conductive member, such as an aluminum slug or the like is placed. This thermally conductive member passes through an opening in the mother board to the side opposite the array of board contacts. A bottom heat sink is placed opposite the bottom side of the board and contacts the thermally conductive member.

41 Claims, 5 Drawing Sheets

MULTIPLE CHIP MODULE ASSEMBLY FOR TOP OF MOTHER BOARD

RELATED APPLICATION

The following application is related to application Ser. No. 08/389,905 filed Feb. 16, 1995, to be issued on Apr. 8, 1997, as U.S. Pat. No. 5,619,399, entitled MULTIPLE CHIP MODULE MOUNTING ASSEMBLY AND COMPUTER USING SAME.

BACKGROUND OF THE INVENTION

1. Field of the Invention

The present invention relates to techniques for mounting integrated circuits on circuit boards; and more particularly to a more efficient mounting assembly for multiple chip modules which allows easy assembly of computers using multiple chip modules.

2. Description of Related Art

A multiple chip module (MCM) consists of multiple unpackaged integrated circuits assembled into a sub-system the size of traditional single chip packages. One type of multiple chip module includes a substrate, a thin film interconnect structure, and a plurality of integrated circuits mounted on the interconnect structure.

MCMs represent an important new trend in interconnect packaging, offering users higher performance, lower costs, and smaller form factors than traditional printed circuit boards with plated through hole and surface mount technologies.

By eliminating the need for single chip packages, MCM technologies eliminate an entire level of interconnect, and permit significantly greater reductions in product footprint than other interconnect technologies. While the reduction in form factor is itself of great value, MCMs also tend to increase performance and reduce cost. By densely packaging multiple chips onto a substrate, distances are reduced, which generally increases performance because signals do not have to travel so far between components, and results in cost savings through higher yields and reduced material requirements.

Multiple chip modules also create unique mounting problems. In particular, dense functionality means that there are a large number of input/output paths which must be connected from the multiple chip module to the circuit board on which they are mounted. Also, the density of functionality concentrates the sources of heat in a small module. Thus, multiple chip modules must be mounted in a manner which dissipates the heat generated in the small package.

Thus, multiple chip modules present a package with hundreds of leads in a very small footprint, and provide a concentrated source of heat which must be dissipated. For many applications, the heat must be dissipated without active cooling systems such as fans. Thus, the multiple chip module may often be mounted on a heat spreading system, such as large heat conductive plate which spreads the heat over a large area.

Accordingly, it is desirable to implement a multiple chip module which provides for efficient thermal dissipation without use of a fan or other active cooling technology, reduces the size of the system over single chip component implementations, is low cost, provides good electrical characteristics which handle 100 MHz or higher clock rates, and is easily installed and replaced into a completely assembled laptop or notebook case.

SUMMARY OF THE INVENTION

The present invention provides a mounting assembly for a multiple chip module or other circuit module for the top side of a mother board, which allows for efficient thermal dissipation through heat sinks on one or both sides of the module. Further, it provides very dense functionality, high lead counts, good electrical characteristics and easy installation. The invention is particularly useful for mounting processor chip sets in data processing systems with very small form factors such as laptop computers and the like.

According to one aspect, the invention can be characterized as an assembly for electronic components which comprises a board on which to mount electronic components, like a printed wiring board or mother board, having a first side with an array of board contacts, and having an interconnect structure for the array of board contacts and the electronic components mounted on the board. A multiple chip integrated circuit module is included which carries integrated circuits. The multiple chip module in a preferred system consists of a first substrate, such as aluminum, with a multi-layer interconnect structure on one surface of the aluminum substrate. A plurality of integrated circuits is mounted on the interconnect structure on the first substrate. A second substrate surrounds the first substrate. This second substrate may be manufactured using printed wiring board technology, and includes an interconnect structure and an array of circuit contacts. Conductors connect the interconnect structure on the first substrate with the interconnect structure on the second substrate. An interposer for providing electrical connection between the array of circuit contacts on the second substrate of the multiple chip module, and the array of board contacts is placed between the multiple chip module and the board. A thermally conductive baseplate having a first surface in thermal contact with the first and second substrates in the multiple chip module, and having a second surface is included. A heat sink, such as a heat spreader assembly, is placed in contact with the thermally conductive baseplate. This heat sink may be over the top of the mother board, or over the bottom of the mother board and contacting the thermally conductive substrate through a thermal path through the mother board. Also, heat spreaders can be used on both the top and bottom. Using this assembly, the multiple chip module is mounted on top of the mother board using simple, low cost manufacturing steps.

According to another aspect of the invention, the bottom heat sink includes a set of thermally conductive members, such as aluminum slugs or the like, placed on the top of the thermally conductive baseplate. The thermally conductive members pass through openings in the mother board to the side opposite the array of board contacts.

The top and bottom heat sinks comprise heat spreader assemblies in a preferred system which have plates with areas substantially greater than the area of the thermally conductive baseplate for dissipating heat. This provides a high density integrated circuit mounting assembly with heat dissipation structures on both sides of the multiple chip module. The heat spreader assemblies provide for very efficient dissipation of heat, in combination with excellent shielding of electromagnetic emissions.

According to one aspect of the invention, the assembly is held together with a fastener, such as a screw which fastens the thermally conductive baseplate to the printed wiring board and to the heat sinks so that thermal contact is made between the thermally conductive base and the heat sinks, and electrical contact is made between the array of circuit contacts and the array of board contacts through the interposer. The fastener may include, in addition, a first clamp plate coupled with the first heat sink and second clamp plate coupled with the second heat sink. The screw binds the first clamp plate to the second clamp plate through the thermally conductive member. A resilient pad is placed between the second heat sink and the second surface of the printed wiring board in areas opposite the interposer, to ensure stable electrical contact and to account for design tolerances in the design and manufacturing of these components.

The present invention provides a mounting technology for multiple chip modules particularly adapted to use in small laptop or notebook computers, or other small data processing systems. This technology is also suitable for larger systems or any system using integrated circuits. The invention is based on the use of multiple heat spreaders to efficiently distribute the heat load of the multiple chip module to as much of the case of the computer system as possible. The assembly provides thermal and electrical coupling between the components in a reliable format which is easy to implement in manufacturing of mother boards.

Other aspects and advantages of the present invention can be seen upon review of the figures, the detailed description, and the claims which follow.

DETAILED DESCRIPTION

Figure 1:
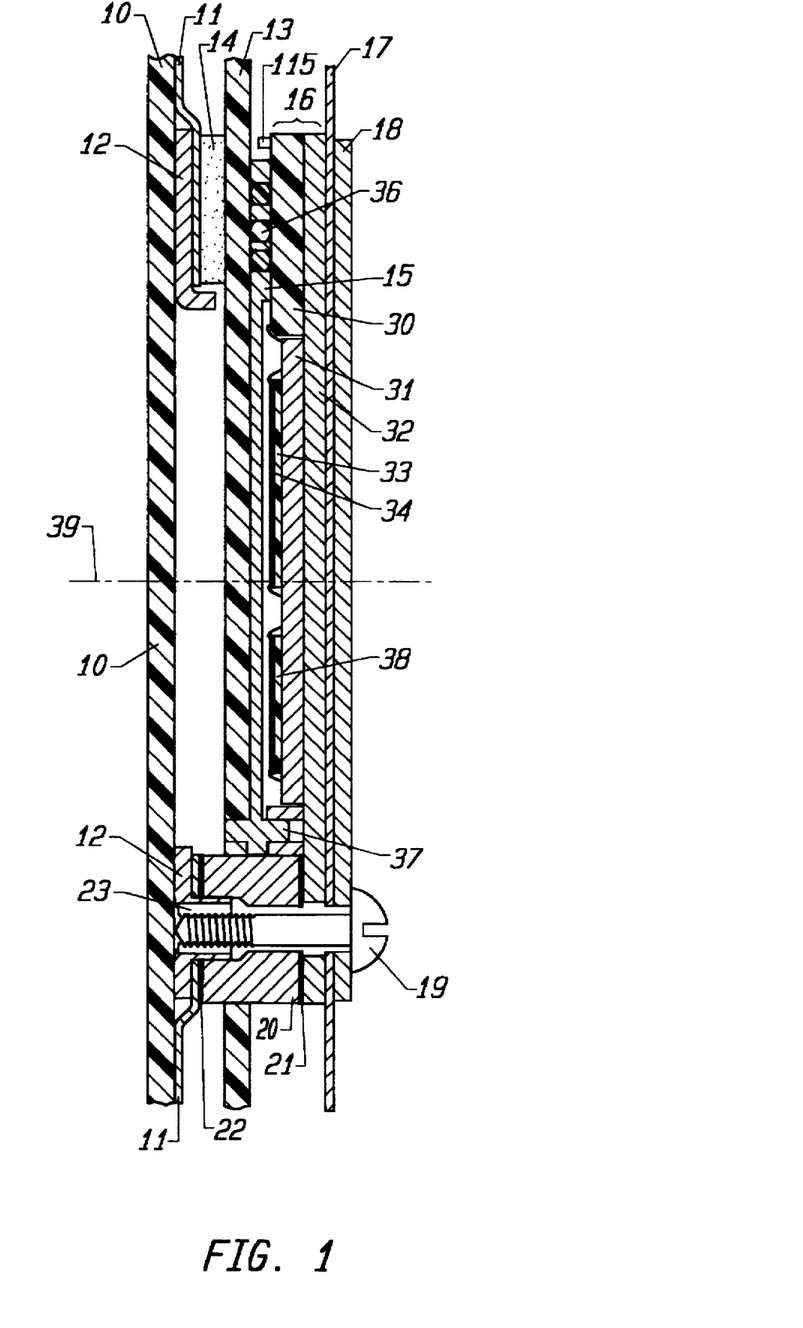
FIG. 1 shows a multichip module mounting assembly according to the present invention.
Figure 2:
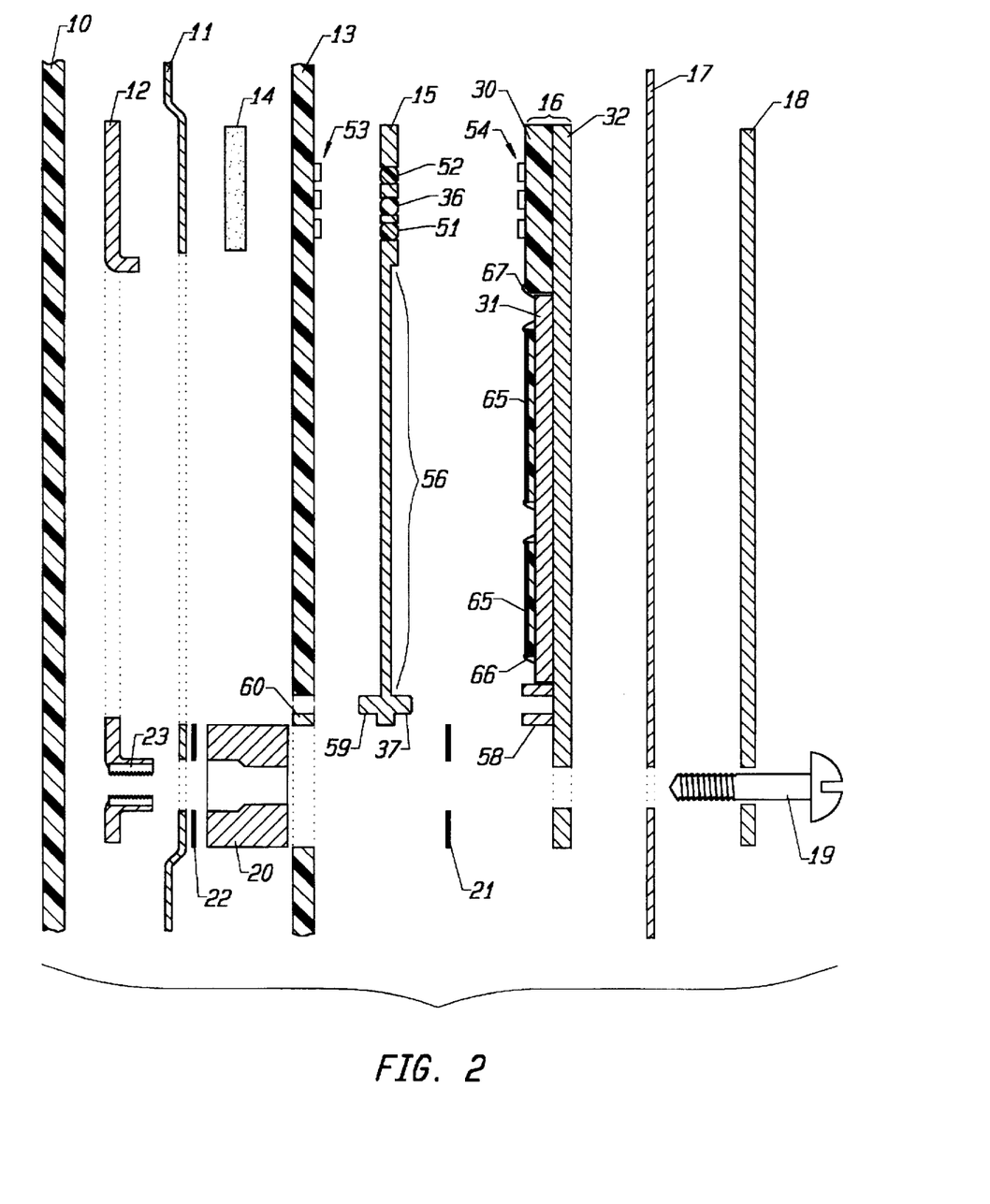
FIG. 2 shows an exploded view of the multichip module mounting assembly of FIG. 1.

A detailed description of a preferred embodiment is provided with reference to FIGS. 1 through 5, in which FIGS. 1 and 2 provide an assembled and an expanded view, respectively, of a preferred embodiment.

FIG. 1 shows an assembled multiple chip module according to the present invention mounted on the chassis of a data processing system. The dimensions and other parameters of the embodiment shown in FIG. 1 are provided as a representative example for the technology used. As shown in FIG. 1, the system includes a chassis bottom 10 which may be manufactured with plastic or other suitable casing material. Coupled to the chassis bottom 10 is a bottom heat spreader 11 manufactured with, for instance, 0.5 mm thick 1100 aluminum, copper, or other good heat conductors. It is referred to as a "bottom" heat spreader because it is placed over the bottom of the mother board, on which typically no electric components, or few electronic components are mounted. A bottom clamp plate 12 (1 mm steel) is coupled to the bottom heat spreader 11 used for mounting as discussed below. A mother board 13 made, for instance, with 0.50" FR4 resin is mounted adjacent the heat spreader assembly 11. A spring pad 14 made of a resilient material, such as, 0.091" free height PORON is provided between the heat spreader 11 and the mother board 13. An interposer template 15 having a 0.050 inch compressed height is placed on top of the mother board 13 opposite from the spring pad 14. A multiple chip module, generally 16, is next to the interposer template. A top heat spreader plate 17 (also, 0.5 mm thick aluminum) is coupled on the opposite side of the multiple chip module 16. It is referred to as a top heat spreader because it is placed over the top of the mother board, on which typically all or a majority of the electronic components are mounted. A top clamp plate 18 (1 mm steel) is on the outside of the top heat spreader plate 17. These components are fastened together by a screw 19 which passes through a thermally conductive member 20 such as a slug of aluminum. This aluminum slug is coupled to the multiple chip module 16 through a thermal pad 21. A thermal pad 22 (Thermagon T-PLI available through Thermagon, Inc. of Cleveland, Ohio, or Chromerics branded materials available through Grace Electronic Materials, Inc. of Woburn, Mass.) is provided on the opposite end of the thermal slug 20. The thermal slug passes through the mother board 13 to the side adjacent to the bottom heat spreader 11. The bottom heat spreader 11 is coupled to the thermal slug through the thermal pad 22 (Thermagon T-PLI). A threaded insert 23 is coupled to the bottom clamp plate 12 and extends into a cut out region in the thermal slug 20. The top clamp plate 18, and the bottom clamp plate 12 are used to clamp the assembly together such that good thermal contact is made between the multiple chip module 16 and the top heat spreader 17, between the multiple chip module and the thermal slug 20, and a between the thermal slug 20 and the bottom heat spreader 11. Also, the clamping establishes electrical contact through the interposer. The bottom heat spreader 11 is coupled with the case 10, by casual contact or for example through thermally conductive adhesive tape from Chromerics or Thermagon, to dissipate heat as much as possible throughout the system.

The multiple chip module assembly 16 includes a first substrate 30 made in the form of a printed wiring board donut consisting of 0.089" thick BT resin board with an interconnect structure form therein. Also, the multiple chip module includes a MCM interconnect substrate 31 consisting of 0.050" aluminum with a multi-layer polyimide and metal interconnect structure formed thereon. A thermally conductive baseplate 32 (for example 0.050 inch aluminum, aluminum nitride or other suitable substrate materials) is coupled to the printed wiring board donut 30 and the MCM interconnect substrate 31. A plurality of integrated circuits, such as circuit 33, are mounted on the MCM interconnect substrate 31 and electrically connected by wire bonding or otherwise. Glob top passivation 34 is placed on top of each of the chips without covering the wire bonds onto the substrate. In alternative systems, the glob top passivation encapsulates the entire set of integrated circuits and the wire bonds. Both the printed wiring board donut 30 and the MCM interconnect structure 31 are mounted on the thermally conductive baseplate 32, such as by epoxy adhesive or otherwise. Electrical contact is made by the conductors, e.g. conductor 36, in the interposer substrate 15, from the printed wiring board 13 and the multiple chip module 16.

The interposer template 15 comprises a rigid or flexible plate with an array of conductors through the plate, arranged such that when pressure is applied to the array of conductors, electrical connection is made between contacts on either side of the plate. Thus, the interposer 15 may be of the type known as CIN::APSE (a trademark of Cinch, a division of Labinal Components and Systems, Inc., located in Elk Grove Village, Ill.) using so-called "fuzz button" conductors 36. The "fuzz button" conductors comprise a gold plated molybdenum wool which fills passages through the interposer material to provide the conductive pathways. Alternative interposer techniques may be used, such as Amplifiex provided by Amp, Inc. of Harrisburg, Pa. Also, so-called z-flex interposer technology can be used, based on z-shaped wires imbedded in an elastomer, which establish electrical connection upon application of pressure.

Figure 3:
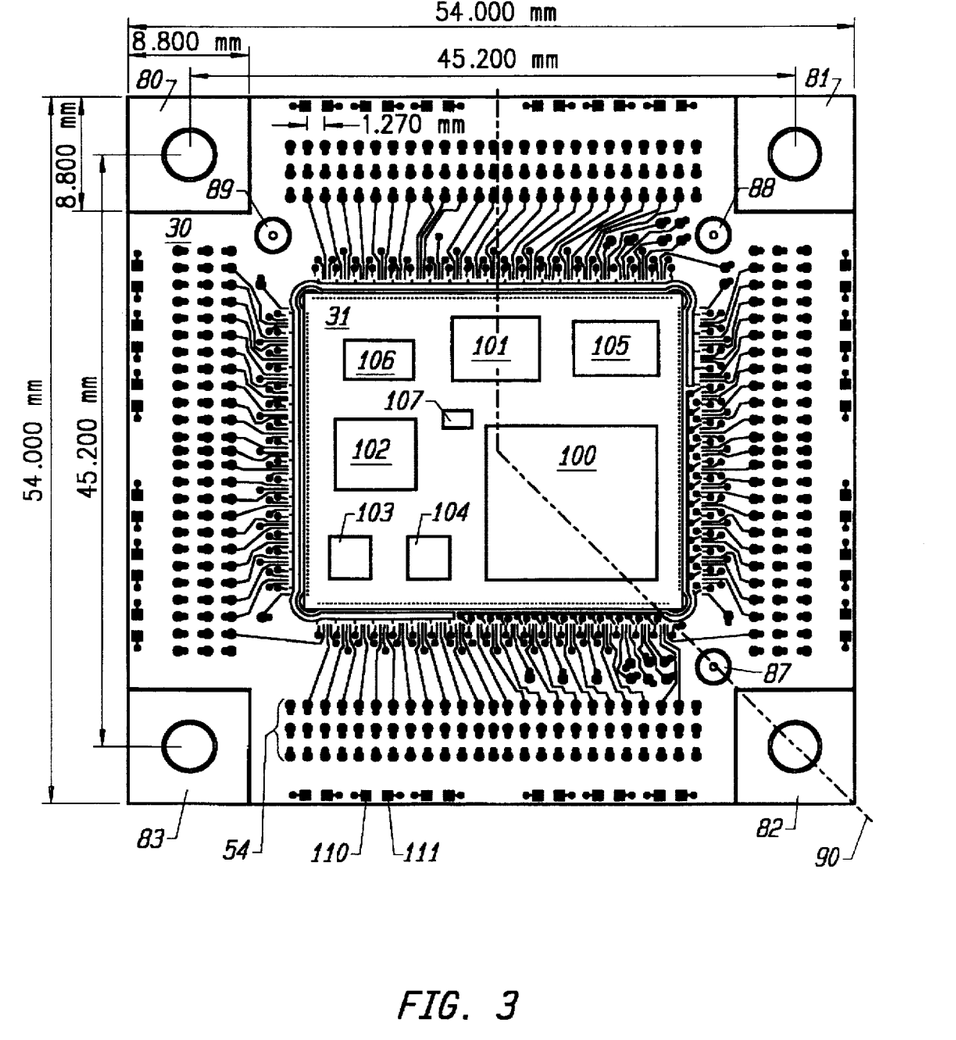
FIG. 3 shows a plan view of one preferred multiple chip module used in the assembly of FIGS. 1 and 2, carrying a processor and supporting chips.

The drawing in FIG. 1 is a cross-sectional view which is taken along line 90 shown in FIG. 3, which passes at an angle through the mounting screw 19 and an alignment boss 37 for the interposer substrate to a point at line 39 in FIG. 1 intersecting the integrated circuit chip 38. From this point at line 39, the cross-section extends out of the MCM structure without intersecting a screw or alignment boss to show the interposer electric contacts and the resilient spring pad 14.

In an alternative system, the bottom heat spreader 11 and spring pad 14 are not utilized. In this alternative, the threaded insert 23 and clamp plate 12 are coupled directly to the mother board 13 and no thermal slug is necessary.

An exploded view of the components of the FIG. 1 is provided in FIG. 2. The components in FIG. 2 are given the same reference numbers as those in FIG. 1. Thus, the figure shows the chassis bottom 10, the bottom clamp plate 12, the bottom heat spreader 11, the spring pad 14, the mother printed wiring board 13, the interposer template 15, the multiple chip module assembly 16, the top heat spreader 17 and the top clamp plate 18. The assembly is fastened by the screw 19 which is coupled from the top clamp plate 18 to the bottom clamp plate 12 using the threaded insert 23. The thermal path is provided from the baseplate 32 and the slug 20, of the MCM through the thermal slug 20 to the bottom heat spreader 11. Thermal pads 21 and 22 improve thermal conduction between the baseplate 32 and between the slug 20 and bottom heat spreader 11.

As shown in FIG. 2, the interposer template includes a plurality of conductors, such as conductors 36, 51 and 52. These conductors provide for an electrical connection between an array of board contacts, generally 53, on the mother printed wiring board 13, and an array of circuit contacts, generally 54, on the multiple chip module assembly 16. The array of board contacts 53 and the array of circuit contacts 54 are shown with exaggerated height in the figure. The interposer template 15 in this preferred embodiment also acts as a cap for the multiple chip module assembly 16. Thus, it includes a thinner region generally 56 over the integrated circuits in the multiple chip module assembly 16.

The interposer template 15 also includes an alignment boss 37 which cooperates with opening 58 in the printed wiring board donut 30. Further, an alignment boss 59 is included which cooperates with opening 60 in the mother printed wiring board 13.

Also, as shown in FIG. 2, each integrated circuit includes a glob top passivation layer 65. In this example, the passivation layer does not cover the wire bonds, such as bond 66, between the integrated circuit and the interconnect structure on the MCM interconnect substrate 31 at the bond to the interconnect structure. This allows the chips to be removed, if necessary, and new chips to be rebonded on to the interconnect substrate 31. Furthermore, FIG. 2 illustrates the conductors 67 which are provided between the interconnect structure on the printed wiring board donut 30 and the interconnect structure on the MCM interconnect substrate 31. These conductors are typically wire bonded connectors such as typically used for connecting integrated circuits to printed wiring boards and to the interconnect substrate 31.

Furthermore, in a preferred system, the baseplate 32 is bonded to the printed wiring board donut 30 and the MCM interconnect substrate 31 in order to provide good mechanical and thermal connection among the components of the multiple chip module assembly 16.

An additional feature illustrated in FIG. 2 is that the bottom heat spreader 11 and the top heat spreader 17 include aluminum plates that have an area substantially greater that than the area of the baseplate 32 and preferably extending throughout as much of the chassis case as possible. This provides for dissipation of heat across a large area in the data processing system.

Although a single thermal slug 20 is shown in the drawings of the FIGS. 1 and 2, a preferred system includes a plurality of such thermal slugs. The number and arrangement of thermal slugs or other thermally conductive members will depend on the particular application chosen based on such factors as the heat transfer requirements and materials involved.

The printed wiring board donut substrate 30, according to one example, is made using a multilayer interconnect, resin printed wiring board, using a resin such as so-called FR5 or BT. Such multilayer resin printed wiring boards are available from a variety of manufacturers, including Hadco of Watsonville, Calif., Yamamoto Manufacturing U.S.A., Inc. of San Jose, Calif., and Carolina Circuits, a division of Amp, Inc. of Greenville, S.C. Because space is a premium in the manufacturing of multichip substrates, such as the substrate 31, the use of the printed wiring board donut can significantly reduce the overall cost of a multiple chip module system such as that described in the present application. Alternative systems may place the array of circuit contacts directly on the MCM interconnect substrate 31.

According to a preferred embodiment, the pads on the MCM substrate are implemented with gold plating, such as gold plated copper, or gold plated nickel, to facilitate wire bonds. The wire bonding utilized between the substrates and between the chips and the substrates, can be made using any of a variety of wire bonding techniques. For instance, so-called ball bonding and stitch bonding may be used. In a preferred system, a combination of ball and stitch bonding is utilized. According to ball bonding, a gold wire is heated at the tip to form a melted drop. This melted drop is then contacted with the pad which forms an electrical connection as it cools. According to stitch bonding, the wire is bonded to the pad by a combination of heating and compression under ultrasonic vibration. The wire bonding can be accomplished using wire in a wide range of sizes, including for example; 1.3, 1.0, and 0.8 mil gold wire.

Alternative systems can be implemented with other chip connector techniques, including so-called flip chip bonding, which utilize alternatives to wire bonding to form conductors to the interconnect on the MCM substrate.

According to one aspect of the invention, the integrated circuits 90 comprise processing resources for a laptop computer, such as a host central processing unit, and memory controller chips and the like supporting the host processing unit. Using multiple chips, a variety of host architectures can be implemented on the multichip module, all having a standardized array of contacts. Using a standardized array of contacts for a variety of host processors, allows a common printed circuit board to be utilized in manufacturing computers, independent of the host processor chosen. Thus, for example, a single printed wiring board can be utilized for 386 class processors, 486 class processors, Pentium class processors, and a variety of RISC based processors which are being introduced.

FIG. 3 shows a sample layout view of a multiple chip module assembly used in the system of FIG. 1 and 2. The drawing shows the basic dimensions of one preferred embodiment, as well as, the layout of the integrated circuits on the MCM interconnect substrate 31. The printed wiring board donut 30 is shown including the array of circuit contacts, generally 54, formed on the printed wiring board donut. Cut outs in the printed wiring board donuts at each corner accommodate the thermal slugs 80, 81, 82 and 83. Also, openings 87, 88, 89 are formed in the printed wiring board donut 30 to accommodate the alignment bosses of the interposer template, as discussed above. The line 90 illustrates the cut along which the cross-section of FIG. 1 is taken which passes through the thermal slug 82, the alignment boss opening 87, the integrated circuit chip 100, the integrated circuit chip 101, and the printed wiring board donut region on the top of the Figure. Arrayed around the outer perimeter of the printed wiring board donut 30 are contacts 110, 111, which are formed to accept electronic components on the printed wiring board 30. In a preferred system, these components consist of bypass capacitors (e.g., capacitor 115 on FIG. 1 which could be for example 0.001 microfarad single components about 60 by 30 by 30 mils) which help manage high frequency noise in the system.

As shown in the drawing, for this embodiment, the printed wiring board donut 30 is about 54 mm square with about 9.0 mm square cut outs for the thermal slugs 80 through 83. MCM interconnect substrate 31 supports eight integrated circuits, including a CPU/100, such as a Intel Pentium class P54LM microprocessor which has dimensions of about 10 to 12 mm by 10 to 12 mm. Also, a supporting chip set, including, for example, the Intel MTSC 102, the Intel MTDP 103 and the Intel MTDP 104. The MTSC 102 is about 200 to 250 mils by 200 to 250 mils and the MTDPs 103,104 are both about 125 to 150 mils by 125 to 150 mils.

Also, the chips 101, 105 and 106 are mounted on the MCM substrate 31. These three chips consist of SRAM Memory, such as a Samsung KM68257C SRAM (5.29×3.11 mm) for chip 106, a Samsung KM732V588 burst SRAM (6.77×5.15 mm) for chip 101 and a Micron S27A MT58LC32K32D7 SyncBurst RAM (6.63×4.78 mm) for chip 105. Finally, a chip 107 is mounted adjacent to CPU chip 100. The chip 107 is a thermal sensor chip, such as a National Semiconductor LM75 (53×30 mils).

Figure 4:
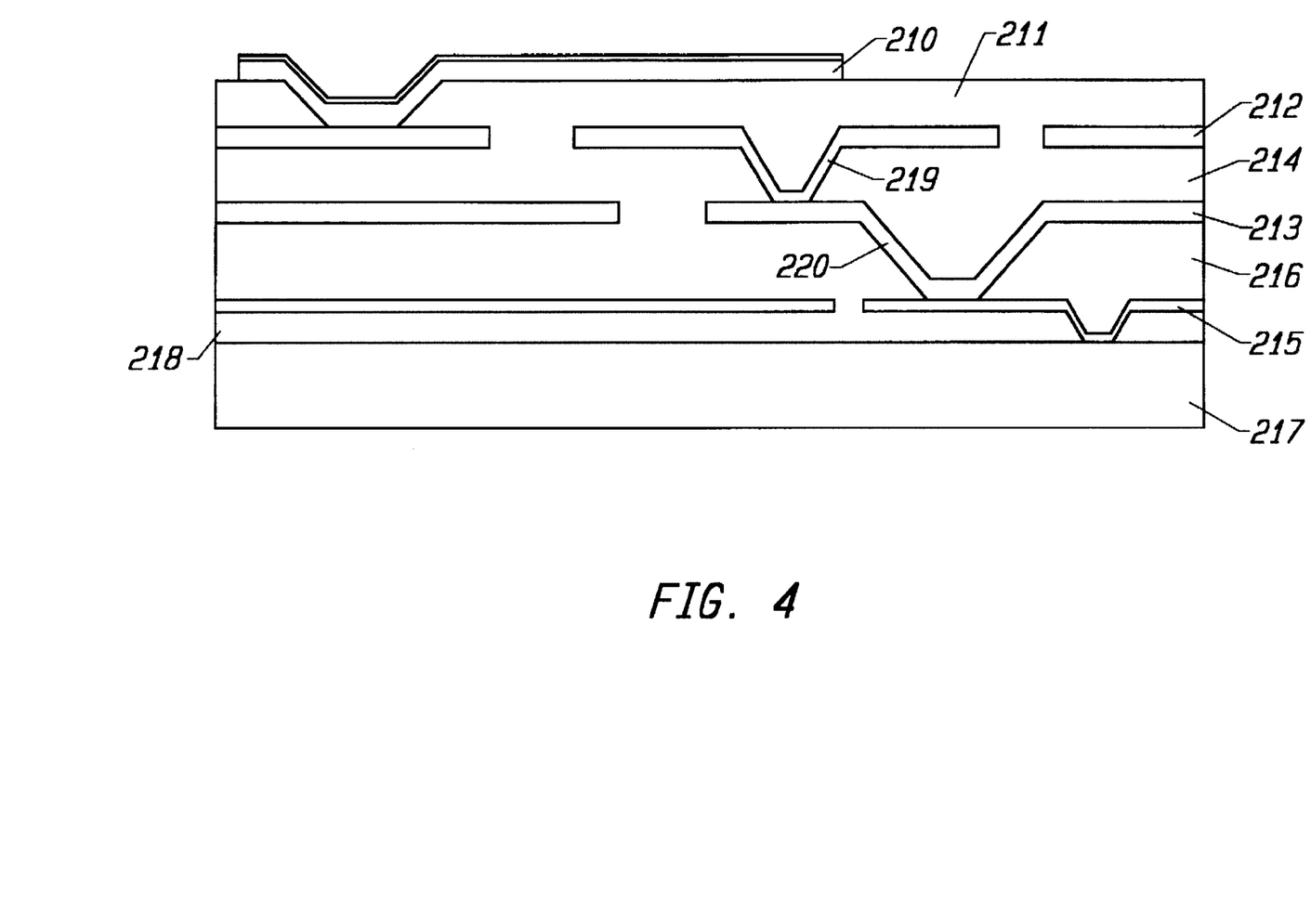
FIG. 4 illustrates a technology which may be used for the interconnect structure for the multichip module of FIGS. 1 to 3.

FIG. 4 illustrates an interconnect structure for the MCM. The interconnect structure may be made using commercially available substrate processes provided by MicroModule Systems, Inc. of Cupertino, Calif. One to seven layers, or more, of interconnect structure can be built using the standard process.

The interconnect structure as illustrated in FIG. 4 consists of a pad 210 having six microns of copper, two microns of nickel, and two microns of gold. The pad is isolated from underlying interconnect by twelve microns of polyimide in the region 211. A y-interconnect layer is included based on four microns of copper 212. An x-interconnect layer 213 consisting of about four microns of copper is included, separated from the y-interconnect layer 212 by about six microns of polyimide in the region 214. A power plane layer 215 consisting of about 2 microns of copper underlies the x-interconnect layer 213 and is separated there from by about twelve microns of polyimide in the region 216. A ground plane 217 consisting of fifty mils of aluminum in this illustration (or two microns of copper), is included, separated from the power plane conductor 215 by a supply bypass dielectric of about 3.5 microns of polyimide in the region 218. The various layers are interconnected as illustrated in the figure by the via structures generally 219 and 220. The interconnect layers are defined using standard photolithography equipment, traces are sputtered and then electroplated up to the necessary thickness. To improve shielding of electromagnetic emissions, a top metal layer of the interconnect may be formed in a way to cover as much of the interconnect structure as possible, (taking into account signal path and chip mounting requirements) and be grounded or otherwise held at a constant potential.

Figure 5:
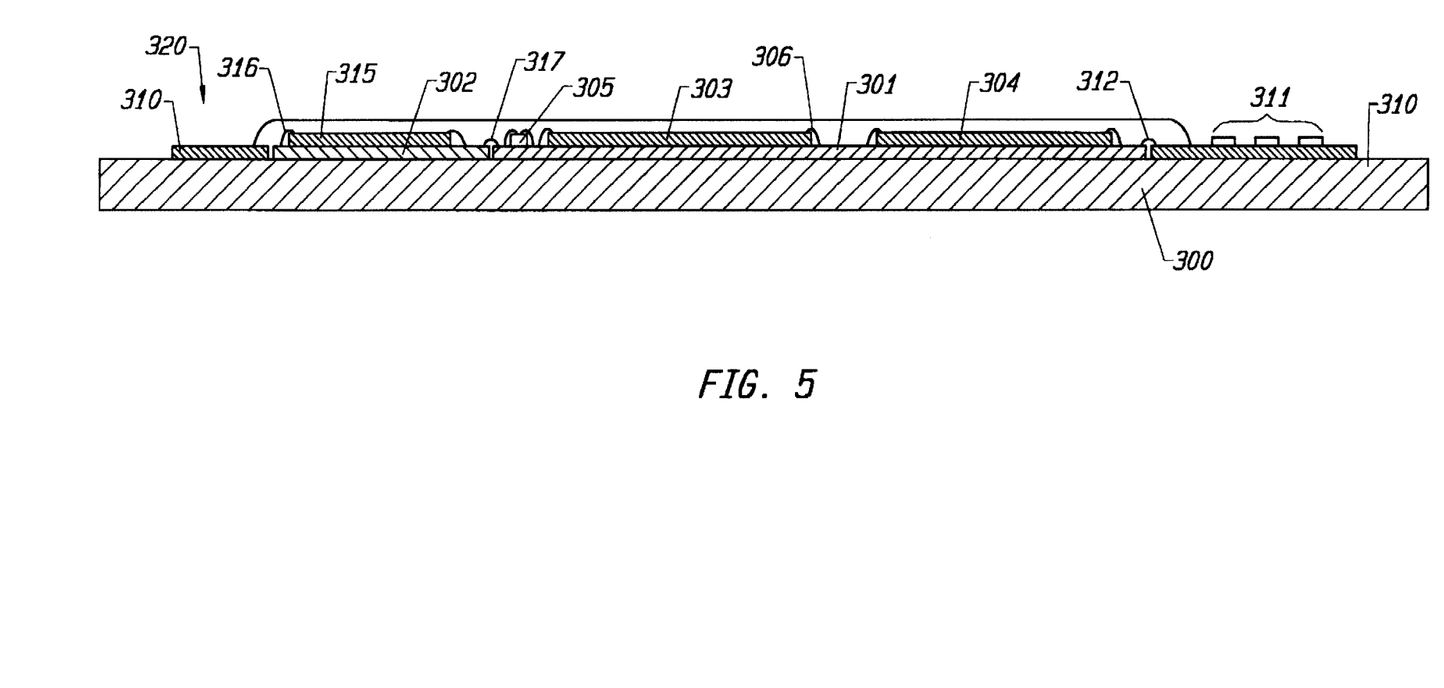
FIG. 5 illustrates an alternative embodiment of the multiple chip module including a plurality of substrates on a single thermal baseplate according to the present invention.

FIG. 5 illustrates a multiple chip module which includes a plurality of separate substrates on a single thermal base plate. Thus, in FIG. 5, the thermal base plate 300 is provided which is manufactured using aluminum or other rigid thermally conductive material. This thermal base plate 300 corresponds to the thermal base plate 32 in the assembly of FIGS. 1 and 2.

The assembly in FIG. 5 includes a first multiple chip module substrate 301 and a second multiple chip module substrate 302 mounted on the thermal base plate 300. The first multiple chip module substrate 301 includes integrated circuits 303 and 304, such as a host CPU and a supporting chip set for a personal computer. Also coupled to the substrate 301 in the embodiment shown in FIG. 5 is a thermal sensing integrated circuit 305, such as a National Semiconductor LM45 or LM75. The substrate 301 includes an interconnect structure such as that described above with reference to FIG. 4. Also, wire bonds, for instance bond wire 306, are used for coupling the integrated circuit pads to the interconnect structure on the substrate 301.

The multiple chip module shown in FIG. 5 also includes a second substrate 310. The second substrate 310 includes an array of circuit contacts generally 311, having exaggerated height in the figure, which correspond to the circuit contact array 54 on the multiple chip module substrate 16 in the system of FIGS. 1 and 2. Conductors 312 provide connection between the interconnect structure on the substrate 301, and the interconnect structure on the substrate 310. According to a preferred embodiment, the substrate 310 is manufactured using printed wiring board material, which may be much lower cost than the aluminum substrate, polyimide/copper interconnect structure of the substrate 301. Also, in one implementation, an integrated circuit 321 is mounted on the printed wiring board substrate 310. This integrated circuit 321 may be for example a programmable logic device or other "glue logic" chip supporting the integrated circuits 303, 304, 305, 315 in the multichip module. The integrated circuit 321 is connected to the other circuits through the wiring patterns of the printed wiring board substrate 310. Also, it may be connected as well using wire bonds more directly to one of the substrates 310 or 302.

A third substrate 302 is shown in FIG. 5 on the multiple chip module, which may include one or more integrated circuits, such as a cache memory expansion chip 315. The chip 315 is coupled to the interconnect structure on the substrate 302 using wire bonds, such as wire bond 316. Also, conductors 317 are used for coupling the interconnect structure of the substrate 302 with the interconnect structure of the substrate 301. The printed wiring board substrate 310 extends around the multiple chip module as shown. In this embodiment, there are no contacts in the area generally 320 of the printed wiring board substrate 310. This allows for variations of the same multiple chip module to be mounted in the same foot print, some of the variations having the cache extension on substrate 302, and some manufactured without the substrate 302 at all. Thus, a three sided interposer and interconnect structure would be utilized with this type of structure. Alternatively, the contact array on the printed wiring board may extend on all four sides of the structure.

Although the substrates 301, 302, 310 are shown in the figure flush with a flat surface of the thermal base plate 300, these substrates may be recessed within cut outs in the base plate 300 if desired, for improved thermal coupling or other reasons as suits the needs of a particular implementation.

Use of the thermal sensor chip 305 on the substrate 301 provides close coupling of the thermal sensing with the chips on the substrate. Thus, if one of the chips on the substrate is a host CPU which generates significant waste heat, the thermal sensing chip can be utilized with control logic to avoid overheating of the CPU. Close coupling of the thermal sensing with the CPU provides greater control over thermal cycling processes than is available in prior art techniques.

Accordingly, the present invention provides multichip module mounting technology for use with laptop or notebook computers (and any other systems using integrated circuits) which achieves several advantages. Efficient thermal dissipation is accomplished without requirement of a fan. The size in layout of a mother board using an MCM is vastly reduced as compared to single chip packaging approaches. The assembly is low cost and simple to manufacture. The system provides very good electrical characteristics, capable of handling 100 MHz clocks and higher. Further, the system is easily installable into a completely assembled laptop/notebook case, so that it can installed by unskilled labor, or consumers using simple tools.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An assembly for mounting electronic components, comprising: a board on which to mount electronic components, having an interconnect structure for the electronic components mounted on the board, the board having a first side including an array of board contacts connected with the interconnect structure, and having a second side;

a multiple chip integrated circuit module, having a first side including an array of circuit contacts facing the first side of the board and having a second side;

a connector including an array of conductors to provide electrical connection between the array of circuit contacts and the array of board contacts;

a thermally conductive member extending from the multiple chip integrated circuit module through the second side of the board;

a bottom heat sink opposite the second side of the board and contacting the thermally conductive member a top heat sink in thermal contact with the second side of the multiple chip integrated circuit module; and a clamp mechanism which clamps the, multiple chip integrated circuit module, connector, and board between the top heat sink and bottom heat sink to establish thermal contact between the top and bottom heat sink and the multiple integrated circuit chip module and to establish electrical contact, through the connector, between the array of circuit contacts and the array of board contacts.

2. The assembly of claim 1, wherein the clamp mechanism comprises:

a first clamp plate coupled with the top heat sink;

a second clamp plate coupled with the board;

a screw binding the first clamp plate to the second clamp plate.

3. The assembly of claim 1, wherein the clamp mechanism comprises:

a first clamp plate coupled with the top heat sink;

a second clamp plate coupled with the bottom heat sink;

a screw binding the first clamp plate to the second clamp plate; and a resilient pad between the bottom heat sink and the second surface of the board.

4. The assembly of claim 3, wherein the thermally conductive member comprises a metal spacer having a passage for receiving the screw.

5. The assembly of claim 1, wherein the top heat sink comprises a heat spreader assembly including a plate having an area larger than the multiple chip integrated circuit module for dissipating heat.

6. The assembly of claim 1, wherein the top and bottom heat sinks comprise respective heat spreader assemblies, the heat spreader assemblies including respective plates having areas larger than the multiple chip integrated circuit module for dissipating heat.

7. The assembly of claim 1, wherein the multiple chip integrated circuit module includes:

a first substrate including at least one integrated circuit chip and an interconnect structure for the integrated circuit mounted on the first substrate;

a second substrate adjacent the first substrate including an interconnect structure and the array of circuit contacts; and conductors connecting the interconnect structure on the first substrate with the interconnect structure on the second substrate.

8. The assembly of claim 7, including an electronic component mounted on the second substrate.

9. The assembly of claim 7, including an integrated circuit mounted on the second substrate.

10. The assembly of claim 7, wherein the multiple chip integrated circuit module includes a thermally conductive base on which the first and second substrates are mounted, and wherein the first substrate comprises thermally conductive material bonded to the thermally conductive base.

11. The assembly of claim 7, wherein the multiple chip integrated circuit module includes a third substrate, including at least one integrated circuit chip and an interconnect structure for the integrated circuit mounted on the third substrate, and conductors for connecting the interconnect structure on the third substrate to the interconnect structure on the first substrate.

12. The assembly of claim 7, wherein the second substrate comprises a resin printed wiring board.

13. The assembly of claim 1, wherein the multiple integrated circuit chip module comprises:

a thermally conductive substrate and a multilayer interconnect structure on the thermally conductive substrate;

a plurality of integrated circuits mounted on the multilayer interconnect structure; and electrical connections between the plurality of integrated circuits and the multilayer interconnect structure.

14. The assembly of claim 13, wherein the multilayer interconnect structure of said multiple chip integrated circuit module comprises alternating layers of insulators and patterned conductors.

15. The assembly of claim 13, wherein the multiple integrated circuit module includes:
- a resin substrate adjacent the thermally conductive substrate, including an interconnect structure and the array of circuit contacts; and
- conductors connecting the interconnect structure on the thermally conductive substrate with the interconnect structure on the resin substrate.

16. The assembly of claim 1, including a plurality of integrated circuits mounted on the first side of the board and connected with the interconnect structure on the board.

17. An assembly for mounting electronic components, comprising:
- a board on which to mount electronic components, having an interconnect structure for the electronic components mounted on the board, the board having a first side including an array of board contacts connected with the interconnect structure, and having a second side;
- a multiple chip integrated circuit module, having a first side including an array of circuit contacts facing the first side of the board and having a second side, and the multiple chip integrated chip circuit module including on the first side;
  - a multilayer interconnect and a plurality of integrated circuit chips, and the multilayer interconnect including a thermally conductive material and the plurality of integrated circuit chips in electrical communication with the multilayer interconnect and the multilayer interconnect in electrical communication with the array of circuit contacts:
- a connector including an array of conductors to provide electrical connection between the array of circuit contacts and the array of board contacts;
- a bottom heat sink, mounted over the second side of the board, in thermal contact with the multiple chip integrated circuit module, including a thermally conductive member extending through the board to contact the multiple chip integrated circuit module; and
- a clamp mechanism which clamps the connector and board between the multiple chip integrated circuit module and the bottom heat sink to establish thermal contact between the bottom heat sink and the multiple integrated circuit chip module and electrical contact, through the connector, between the array of circuit contacts and the array of board contacts.

18. The assembly of claim 17, including:
- a top heat sink in thermal contact with the multiple chip integrated circuit module, over the second side of the multiple chip integrated circuit module.

19. The assembly of claim 17, wherein the clamp mechanism comprises:
- a first clamp plate coupled with the bottom heat sink;
- a second clamp plate coupled with the multiple chip integrated circuit module;
- a screw binding the first clamp plate to the second clamp plate; and
- a resilient pad between the bottom heat sink and the second surface of the board.

20. The assembly of claim 17, wherein the bottom heat sink comprises a heat spreader assembly including a plate having an area larger than the multiple chip integrated circuit module for dissipating heat.

21. The assembly of claim 18, wherein the top and bottom heat sinks comprise respective heat spreader assemblies, the heat spreader assemblies including respective plates having areas larger than the multiple chip integrated circuit module for dissipating heat.

22. The assembly of claim 17, wherein the multiple chip integrated circuit module includes:
- a first substrate including the at least one integrated circuit chip and the multilayer interconnect for the integrated circuit mounted on the first substrate;
- a second substrate adjacent the first substrate including an interconnect structure and the array of circuit contacts; and
- conductors connecting the interconnect structure on the first substrate with the interconnect structure on the second substrate.

23. The assembly of claim 22, including an electronic component mounted on the second substrate.

24. The assembly of claim 22, including an integrated circuit mounted on the second substrate.

25. The assembly of claim 22, wherein the multiple chip integrated circuit module includes a thermally conductive base on which the first and second substrates are mounted, and wherein the first substrate comprises thermally conductive material bonded to the thermally conductive base.

26. The assembly of claim 22, wherein the multiple chip integrated circuit module includes a third substrate, including at least one integrated circuit chip and an interconnect structure for the integrated circuit mounted on the third substrate, and conductors for connecting the interconnect structure on the third substrate to the interconnect structure on the first substrate.

27. The assembly of claim 22, wherein the second substrate comprises a resin printed wiring board.

28. The assembly of claim 22, including an electronic component on the second substrate.

29. The assembly of claim 17, wherein the multilayer interconnect structure of said multiple chip integrated circuit module comprises alternating layers of insulators and patterned conductors.

30. The assembly of claim 17, wherein the multiple integrated circuit chip module includes:
- a resin substrate adjacent the multilayer interconnect and the at least one integrated circuit chip, and said resin substrate, including an interconnect structure and the array of circuit contacts; and
- conductors connecting the multilayer interconnect with the interconnect structure on the resin substrate.

31. The assembly of claim 17, including a plurality of integrated circuits mounted on the first side of the board and connected with the interconnect structure on the board.

32. An assembly for components of a data processing system, comprising:
- a board on which to mount electronic components, the board having a first side including an array of board contacts, having a second side, and having an interconnect structure for the array of board contacts and the electronic components mounted on the board,
- a thermally conductive base having a first surface and a second surface;
- a first substrate on the first surface of the thermally conductive base including a multilayer interconnect structure, an integrated circuit processor chip and at least one supporting chip mounted on the multilayer interconnect structure, and electrical connections from the integrated circuit processor chip and the at least one supporting chip to the multilayer interconnect structure and the multilayer interconnect structure including a thermally conductive material to transfer heat from the chips to said thermally conductive base;

a second substrate on the first surface of the thermally conductive base adjacent the first substrate including an array of circuit contacts;

conductors connecting the interconnect structure on the first substrate with the array of circuit contacts on the second substrate;

a connector providing electrical connection between the array of circuit contacts and the array of board contacts;

a first heat sink assembly adjacent the second surface of the thermally conductive base, including a plate having an area larger than the thermally conductive base for dissipating heat;

a thermally conductive member extending from the thermally conductive base through the second surface of the board; and a second heat sink assembly adjacent the second surface of the board and contacting the thermally conductive member, including a plate having an area larger than the thermally conductive base for dissipating heat;

a fastener which fastens the thermally conductive base, the first and second substrates, the connector and the board between the first and second heat sink assemblies such that thermal contact is made between the chips and the first and second heat sinks via the thermally conductive base and electrical contact is made through the connector between the array of circuit contacts and the array of board contacts.

33. The assembly of claim 32, wherein the fastener comprises:

a first clamp plate coupled with the first heat sink assembly;

a second clamp plate coupled with the second heat sink assembly;

a screw binding the first clamp plate to the second clamp plate; and a resilient pad between the second heat sink and the second surface of the board.

34. The assembly of claim 32, wherein the thermally conductive base is bonded to the first substrate.

35. The assembly of claim 32, including a third substrate on the first surface of the thermally conductive base, including at least one integrated circuit chip and an interconnect structure for the integrated circuit mounted on the third substrate, and conductors for electrically connecting the interconnect structure on the third substrate to the array of circuit contacts on the second substrate.

36. The assembly of claim 32, wherein the second substrate comprises a resin printed wiring board.

37. The assembly of claim 32, including a chassis on which the board is mounted, and wherein the second heat sink assembly is coupled to the chassis.

38. The assembly of claim 32, including an electronic component on the second substrate.

39. The assembly of claim 32, including an integrated circuit mounted on the second substrate.

40. An assembly for electronic components, comprising:

a board on which to mount electronic components, having an interconnect structure for the electronic components mounted on the board, the board having a first side including an array of board contacts connected with the interconnect structure, and having a second side;

a multiple chip integrated circuit module, having a first side including an array of circuit contacts facing the first side of the board and having a second side;

a) a first substrate including at least one integrated circuit chip and an interconnect structure for the integrated circuit mounted on the first substrate;

b) a second substrate adjacent the first substrate including an interconnect structure and the array of circuit contacts;

c) conductors connecting the interconnect structure on the first substrate with the interconnect structure on the second substrate d) a thermally conductive base on which the first and second substrates are mounted, and wherein the first substrate comprises thermally conductive material bonded to the thermally conductive base an connector including an array of conductors to provide electrical connection between the array of circuit contacts and the array of board contacts;

a top heat sink in thermal contact with the second side of the multiple chip integrated circuit module; and a clamp mechanism which clamps the board, connector, multiple chip integrated circuit module, and top heat sink together to establish thermal contact between the top heat sink and the multiple integrated circuit chip module and electrical contact, through the connector, between the array of circuit contacts and the array of board contacts.

41. An assembly for electronic components, comprising:

a board on which to mount electronic components, having an interconnect structure for the electronic components mounted on the board, the board having a first side including an array of board contacts connected with the interconnect structure, and having a second side;

a multiple chip integrated circuit module, having as first side including an array of circuit contacts and having a second side, mounted over the first side of the board;

a) a first substrate including at least one integrated circuit chip and an interconnect structure for the integrated circuit mounted on the first substrate;

b) a second substrate adjacent the first substrate including an interconnect structure and the array of circuit contacts;

c) conductors connecting the interconnect structure on the first substrate with the interconnect structure on the second substrate d) a thermally conductive base on which the first and second substrates are mounted, and wherein the first substrate comprises thermally conductive material bonded to the thermally conductive base;

an connector including an array of conductors to provide electrical connection between the array of circuit contacts and the array of board contacts;

a bottom heat sink, mounted over the second side of the board, in thermal contact with the multiple chip integrated circuit module, including a thermally conductive member extending through the board to contact the multiple chip integrated circuit module; and a clamp mechanism which clamps the board, connector, multiple chip integrated circuit module, and bottom heat sink together to establish thermal contact between the bottom heat sink and the multiple integrated circuit chip module and electrical contact, through the connector, between the array of circuit contacts and the array of board contacts.

* * * * *